United States Patent [19]

Schroeder

[11] 4,424,493

[45] Jan. 3, 1984

[54] CROSS-COUPLED COMPLEMENTARY POWER AMPLIFIER

[75] Inventor: John O. Schroeder, Trenton, N.J.

[73] Assignee: RCA Corporation, New York, N.Y.

[21] Appl. No.: 296,866

[22] Filed: Aug. 27, 1981

[51] Int. Cl.³ .......................... H03F 3/18; H03F 3/30
[52] U.S. Cl. .................................... 330/263; 330/267
[58] Field of Search ............... 330/263, 264, 267, 268

[56] References Cited

U.S. PATENT DOCUMENTS 4,031,482  6/1977  Tsurushima ........................ 330/267

OTHER PUBLICATIONS

Bogdan, Jr. "High Speed/Low Power Deflection Amplifier", IBM Tech. Dis. Bulletin, vol. 15, No. 8, Jan. 1973.

Primary Examiner—James B. Mullins
Assistant Examiner—Gene Wan
Attorney, Agent, or Firm—E. M. Whitacre; J. S. Tripoli; E. P. Herrmann

[57] ABSTRACT

A power amplifier circuit includes an output complementary emitter-coupled transistor pair driven by a second pair of complementary transistors having a parallel resistor diode combination serially connected between their emitters to establish idling currents. Base drive for the output transistors flows through the resistor of the resistor-diode combination until the potential thereacross exceeds the diode forward breakdown potential after which all increases in drive current pass through the diode. The use of the diode limits the bucking potential in the base current drive circuit thereby enhancing available output power.

6 Claims, 3 Drawing Figures

CROSS-COUPLED COMPLEMENTARY POWER AMPLIFIER

BACKGROUND OF THE INVENTION

This invention relates to power amplifier circuitry and more particularly to complementary emitter follower power output stages.

Complementary-symmetry emitter follower circuit arrangements are well known in the amplifier arts as a means for producing relatively high output power with low driving impedance. Typically the complementary output transistors have their bases biased in a manner to minimize cross over distortion. One common arrangement includes a constant current supply connected to the base electrode of a first of the output transistors, a potential offset circuit connected between the base electrodes of the output transistors and a current amplifier connected to the base electrode of second of the output transistors. The base current drive to the output amplifiers is controlled by the current amplifier shunting current from the constant current supply away from the base electrode of the first output transistor. The output power attainable from such an arrangement is limited by the power dissipated in the bias/driver stage.

A second bias/driver arrangement includes a further pair of complementary transistors for driving the output common emitter transistors. In this arrangement the further transistors have a common base connection for applying signal thereto. The emitter electrodes of the further npn and pnp transistors are respectively connected to the base electrodes of the pnp and npn output transistors. The base electrodes of the output transistors are connected together by a first resistor. Second and third resistors respectively connect the base electrodes of the output npn and pnp transistors to positive and negative supply potential.

In this arrangement signal drive current from the emitter electrode of the respective further transistor is directed to the respective output transistor through the resistor connected between the base electrodes of the output transistors. The voltage developed across this resistor limits the base drive current to the output transistors and thereby the available output power.

BRIEF SUMMARY OF THE INVENTION

The present invention overcomes the limitation of the immediately afore described complementary symmetry emitter follower output stage by including a diode in parallel with the resistor connected between the base electrodes of the output transistors. The diode is poled to conduct in the forward direction whenever the base drive current conducted in the resistor develops a potential sufficient to turn the diode on. The diode passes further increases in drive current to the base electrode of the requisite output transistor with an insignificant increase in potential thereacross thereby eliminating further back bias voltage at the emitter of the drive transistor and enhancing the available output power.

DETAILED DESCRIPTION OF THE INVENTION

Figure 1:
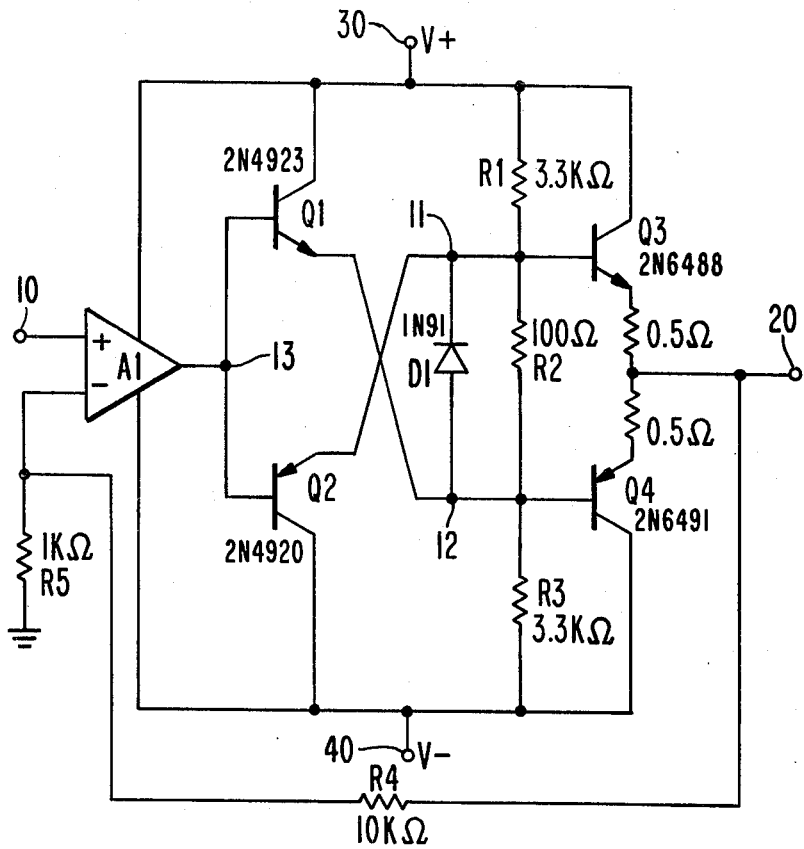
FIG. 1 is a schematic diagram of a power amplifier embodying the present invention.

Referring to FIG. 1, npn transistor Q3 and pnp transistor Q4 having their respective collector electrodes connected to positive, 30, and negative, 40, supply potentials and their respective emitter electrodes connected via 0.5 Ohm resistors to output terminal 20 comprise a complementary symmetry emitter follower push pull amplifier output stage. A resistor R1 connected between positive supply potential 30 and the base electrode connection 11 of transistor Q3 biases transistor Q3 into conduction in the absence of signal. Similarly resistor R3 connected between the negative supply potential 40 and the base electrode connection 12 of transistor Q4 biases transistor Q4 into conduction in the absence of drive signal. A resistor R2, connected between connections 11 and 12 provides a conduction path for base drive signal current from connection 11 to the base electrode of transistor Q4 and from connection 12 to the base electrode of transistor Q3. In the quiescent state a voltage of approximately 1.2 volts is developed thereacross by virtue of the forward biased base emitter potentials of transistors Q3 and Q4, and R2 passes an idling current of approximately 12 mA.

A further pair of complementary transistors Q1 and Q2 are arranged as emitter-follower amplifiers to provide base drive signal current to transistors Q3 and Q4 respectively. Npn transistor Q1 has its collector electrode connected to positive supply terminal 30, its base electrode connected to the output connection of a differential amplifier input stage A1 and its emitter electrode connected to the base electrode of transistor Q4 at connection 12. Pnp transistor Q2 has its collector electrode connected to negative supply terminal 40, its base electrode connected to the output terminal of amplifier A1 and its emitter electrode connected for applying signal current to connection 11. Thus, transistors Q1 and Q2 are biased for normal common collector operation. Note that for zero input and output potential, i.e., the amplifier idling in a quiescent state, the potential at connections 11 and 12 are respectively (+)0.6 and (−)0.6 volts. As a result, with zero potential applied to the base electrodes of transistors Q1 and Q2 they will nevertheless be biased in conduction. Consequently the circuit does not produce crossover distortion since the four transistors are biased for linear operation.

A positive going signal potential applied at the base electrode connection 13 is translated by the base-emitter circuit of transistor Q1 to connection 12 inhibiting base drive to pnp transistor Q4 and raising the base drive potential of Q3. As the potential at connection 13 is increased a portion of transistor Q1 emitter current flows in resistor R2 to supply base drive to transistor Q3. However, as the emitter current of Q1 and thereby the base current of Q3 increases significantly, the potential developed across resistor R2 tends to become appreciable and tends to limit the current available from the emitter circuit of drive transistor Q1.

In a similar fashion pnp transistor Q2 provides base drive currents for pnp output transistor Q4 when the signal potential at connection 13 is negative. Note that with connection 13 negative the base drive current of transistor Q4 flows from output terminal 20 through the emitter-base junction of Q4, through resistor R2 from connection 12 to connection 11 and into the emitter-base junction of transistor Q2. Regardless of whether transistor Q3 or Q4 is being driven by signal current, the base drive signal current flows in resistor R2 from connection 12 to 11. The potential developed across R2 by the base drive current is therefore always poled in the same direction.

Realizing that the potential developed across resistor R2 is always poled in the same direction, the present inventor determined that inclusion of a diode D1 in parallel with resistor R2 would improve the power output capability of the amplifier. The forward dynamic impedance of a diode in conduction is relatively small, and once the diode is biased into conduction there is substantially no potential change thereacross reagardless of the current conducted therein (within its normal operating range of currents). As implemented in the FIG. 1 circuit, base drive current for transistor Q3 (or Q4) is passed by resistor R2 until the potential developed across R2 equals the forward turn-on potential of diode D1. All further increases in drive current are conducted in diode D1 without further increases in potential developed across the resistor-diode combination. Thus, diode D1 and resistor R2 combination provides a substantially linear resistance up to the turn-on potential of the diode and for greater potential differences across points 12 and 11, the resistance value presented by D1, R2 is substantially zero relative to the resistance value of the combination before the diode turns M.

At the crossover point where base drive current is shunted through diode D1, some nonlinearity is produced in the output signal. Operating in an open loop mode, this nonlinearity was determined to be no more than a few percent. The nonlinearity is readily eliminated by applying negative feedback (e.g., via the 10k Ω resistor R4 and 1k Ω resistor R5 as indicated). The power output circuit is thus applicable for audio power output circuitry as well as for applications where linearity is not a critical parameter.

An important feature of the disclosed amplifier is that it is operable down to zero Hertz i.e., at D.C. A further feature is that it is linear for small signals up to about 1.2 volts peak to peak. This result occurs because the bias arrangement eliminates zero crossover distortion and the idling potential of 1.2 volts across R2 must be overcome before the diode D1 and conduct and introduce any nonlinearities.

Figure 2:
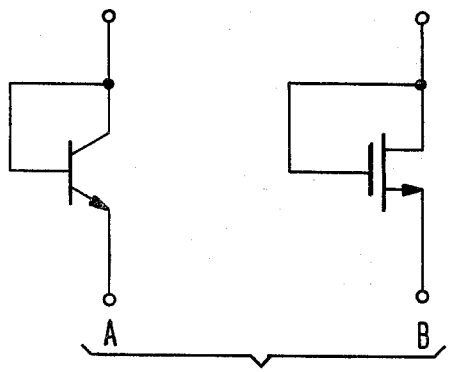
FIGS. 2A and 2B are circuit elements which may be substituted for the diode in the FIG. 1 schematic.

FIGS. 2A and 2B are alternate circuit elements which may be employed in place of diode D1. The bipolar transistor having a common base-collector connection functions similar to a junction diode and will have a comparable turnon voltage. The FET transistor (FIG. 2B) having a common gate-drain connection also operates similar to a diode. However the turn on voltage for such a diode varies considerable from that of a junction diode thereby permitting versatility in design.

It should be appreciated that even though the drive transistors Q1 and Q2 are illustrated as bipolar devices, these devices may be substituted with field effect transistors.

What is claimed is:

1. A linear complementary symmetry common emitter amplifier circuit comprising:
   first and second transistors of a first conductivity type and third and fourth transistors of a second conductivity type, said first, second, third and fourth transistors each having respective first, second and control electrodes, respective principal conduction paths between their respective first and second electrodes and wherein the principal conduction path of each transistor is controlled by potential applied between their respective control and first electrodes;
   first and second terminals for applying relatively positive and relatively negative supply potential;
   an output terminal;
   means connecting the respective second electrodes of the first and second transistors to the first terminal;
   means connecting the respective second electrodes of the third and fourth transistors to the second terminal;
   respective means connecting the respective first electrodes of the first and third transistors to the output terminal;
   respective means connecting the respective first electrodes of the second and fourth transistors to the control electrodes of the third and first transistors respectively;
   means for applying a signal potential to the control electrodes of the second and fourth transistors; and
   means connected between the control electrodes of the first and third transistors, said means exhibiting substantially linear resistance for potentials occurring between the control electrodes of the first and third transistors having less than a prescribed threshold potential and exhibiting a small resistance relative to said linear resistance for potentials between said control electrodes in excess of said threshold potential.

2. The amplifier set forth in claim 1 wherein the means connected between the control electrodes of the first and third transistors comprises the parallel combination of a resistor and a diode, the diode being poled to conduct in the forward direction from the first electrode of the second to the first electrode of the fourth transistor.

3. The amplifier set forth in claim 1 wherein the means connected between the control electrodes of the first and third transistors comprises:
   a resistor
   a fifth transistor having first, second and control electrodes;
   means connecting the control and second electrodes of the fifth transistor to a first node;
   means connecting the resistor between the first node and the first electrode of the fifth transistor in a parallel circuit; and
   means connecting said parallel circuit between the control electrodes of the first and third transistors, the fifth transistor being poled for forward conduction from the first electrode of the second transistor to the first electrode of the fourth transistor.

4. The amplifier circuit set forth in claim 1 or 2 or 3 further including:
   a differential amplifier input stage having an inverting input terminal, a non-inverting input terminal and an output terminal;
   means connecting the output terminal of the differential amplifier output stage to the control electrodes of the second and fourth transistors; and
   feedback means connected between the common-emitter output terminal and said inverting input terminal.

5. A linear amplifier comprising
   a npn first transistor having base, emitter and collector electrodes;
   a pnp second transistor having base, emitter and collector electrodes;

means interconnecting the emitter electrodes of the first and second transistors to form an output terminal of said amplifier;

third and fourth transistor of similar conductivity types to said first and second transistors respectively, said third and fourth transistors having respective first, second and control electrodes, having respective principal conduction paths between their respective first and second electrodes, the respective principal conduction paths being controlled by a potential between the respective control and first electrodes;

means connecting the first electrode of the third transistor to the first electrode of the fourth transistor, said means exhibiting a substantially linear resistance for a potential occurring between the first electrodes being less than a prescribed threshold potential and exhibiting substantially zero resistance relative to said linear resistance for potentials between said first electrodes in excess of said threshold;

respective means connecting the first electrode of the third transistor to the base electrode of the second transistor, and connecting the first electrode of the fourth transistor to the base electrode of the first transistor;

means for applying signal potential to the control electrodes of the second and third transistors; and means for applying relatively positive supply potential to the collector and second electrodes of the first and third transistors respectively and for applying relatively negative supply potential to the collector and second electrodes of the second and fourth transistor respectively.

6. The amplifier set forth in claim 5 further including:

first and second resistors, said first resistor having a first end connected for applying said positive supply potential and a second end connected to the first electrode of said fourth transistor said second resistor having a first end connected for applying said negative supply potential and a second end connected to the first electrode of said third transistor; and said means connecting the first electrodes of the third and fourth transistors including the parallel combination of a diode and a linear resistor.

* * * * *